US009240774B2

(12) United States Patent
Gohel

(10) Patent No.: US 9,240,774 B2
(45) Date of Patent: Jan. 19, 2016

(54) FAST SINGLE-ENDED TO DIFFERENTIAL CONVERTER

(75) Inventor: Tushar K. Gohel, Winchester, MA (US)

(73) Assignee: Teradyne, Inc., North Reading, MA (US)

( * ) Notice: Subject to any disclaimer, the term of this patent is extended or adjusted under 35 U.S.C. 154(b) by 893 days.

(21) Appl. No.: 13/298,019

(22) Filed: Nov. 16, 2011

(65) Prior Publication Data

US 2013/0124134 A1 May 16, 2013

(51) Int. Cl.
*H03K 5/01* (2006.01)
*H03K 5/1534* (2006.01)
*H03K 19/0175* (2006.01)

(52) U.S. Cl.
CPC ............... *H03K 5/01* (2013.01); *H03K 5/1534* (2013.01); *H03K 19/0175* (2013.01)

(58) Field of Classification Search
CPC ............ G01R 31/3025; G01R 31/002; G01R 31/312; G01R 31/318513; G01R 29/0821; G01R 1/0408; G01R 1/0483; G01R 1/06794; G01R 31/2891; G01R 31/308; G01R 31/31905; G01R 19/2516; G01R 1/06772; G01R 1/00
USPC ......................................................... 702/120
See application file for complete search history.

(56) References Cited

U.S. PATENT DOCUMENTS

| 4,595,959 A | 6/1986 | Bailey |
| 5,049,831 A | 9/1991 | Westwick |
| 5,723,975 A * | 3/1998 | Rogers .......................... 324/72.5 |
| 7,105,797 B2 | 9/2006 | Kimura |
| 7,800,449 B2 | 9/2010 | Mulder et al. |
| 2001/0012320 A1 | 8/2001 | Watanabe et al. |
| 2004/0064765 A1* | 4/2004 | Panis ............................. 714/700 |
| 2008/0157873 A1* | 7/2008 | Yokoyama et al. ........... 330/253 |
| 2010/0164622 A1 | 7/2010 | Ge et al. |

FOREIGN PATENT DOCUMENTS

JP 2011-090562 A 5/2011

OTHER PUBLICATIONS

Machine Translation of JP 2011-090562A titled Average Value Detection Circuit and Transimpedance Amplifier, May 6, 2011, pp. 1-10.*
International Search Report and Written Opinion for International Application No. PCT/US2012/059737 mailed Mar. 28, 2013.
(Continued)

*Primary Examiner* — Mischita Henson
(74) *Attorney, Agent, or Firm* — Wolf, Greenfield & Sacks, P.C.

(57) ABSTRACT

A single ended to a differential signal converter. The single ended signal is passed through a high pass filter to block DC components. A positive and a negative version of the filtered signal are used collectively as the differential output of the converter. To allow accurate measurements on the input signal without waiting for the output of the high pass filter to settle, the differential outputs are offset by a dynamically generated signal representative of the midpoint of the filtered signal. That offset is generated by capturing a value representing the midpoint when a signal is first applied. This captured value is allowed to change with a time constant matching a time constant of the high pass filter. The converter may be used to connect a test instrument to a unit under test that generates test signals in a format that the test instrument is not specifically configured to measure.

22 Claims, 4 Drawing Sheets

(56) References Cited

OTHER PUBLICATIONS

Supplementary Partial European Search Report for EP App. No. 12850611.0, dated Mar. 4, 2015.

Rabuske et al., "A Track and Hold for Single-Ended or Differential Input with Adjustable Output Common Mode," IEEE, 54$^{th}$ International Midwest Symposium, 2011, pp. 1-4.

* cited by examiner

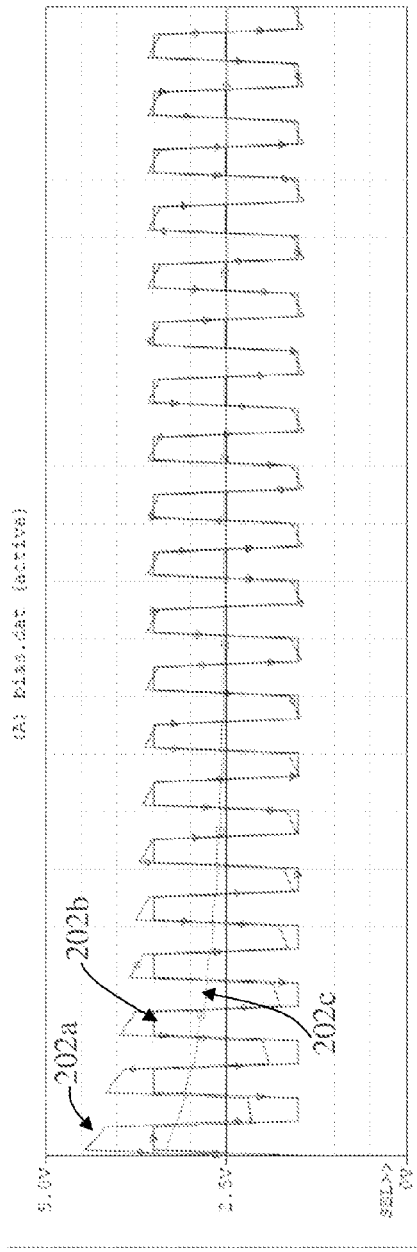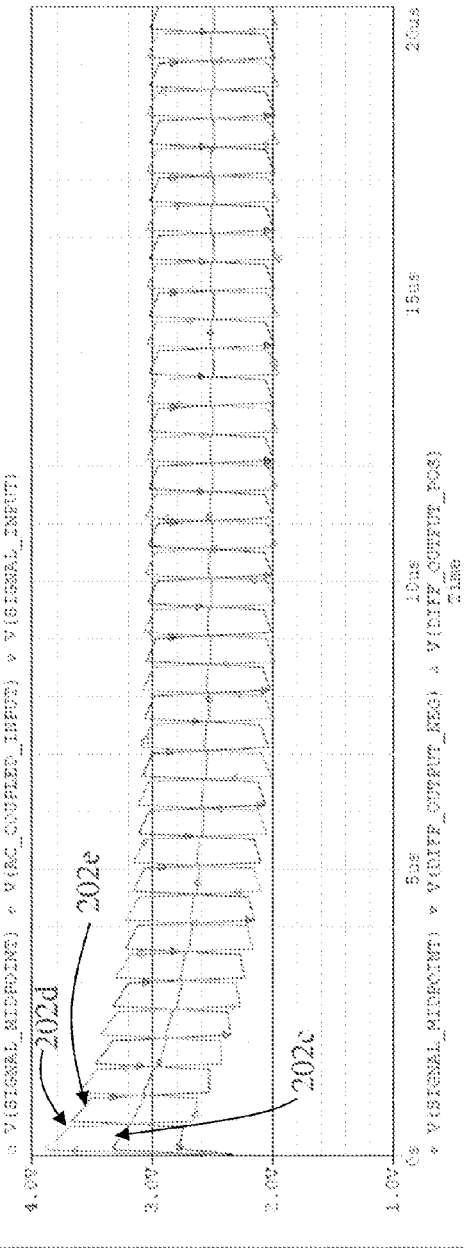
FIG. 2A
FIG. 2B

FAST SINGLE-ENDED TO DIFFERENTIAL CONVERTER

BACKGROUND

1. Field of the Invention

The invention relates generally to testing of electronic systems, and more particularly to signal converters.

2. Related Art

Test instruments are known for testing many types of electronic units under test. For example, instruments to test printed circuit boards and other electronic assemblies are known. Though test instruments come in many forms, a test instrument contains circuitry to generate or measure a test signal. To fully test an electronic unit, the test instrument may be programmable to control multiple parameters of test signals that are generated or measured. In sophisticated instruments, parameters relating to both the magnitude and timing of test signals, for example, may be programmed. Accordingly, test instruments may be sophisticated electronic devices.

Test instruments may be used during multiple stages in the lifecycle of an electronic unit. Test instruments may be used to make repairs after the unit has been fielded. In this role, the test instrument may be used to identify defective components that may be replaced or to identify other corrective actions that might be taken. In other scenarios, test instruments may be used during manufacture of the electronic units. In this capacity, the instruments may be used to identify defects such that the results of testing may be used to impact the manufacture of a device by conditioning certain operations on the results of testing. For example, manufacturing steps that result in the unit being packaged and shipped to a customer may be performed only if testing on a unit indicates that the unit is working properly. If the tests indicate that the unit is not working properly, the unit may be diverted such that different operations to rework or scrap the unit are performed.

Regardless of the specific reason for conducting tests, test instruments may be connected to the units in different ways, depending on the nature of the unit under test. For example, in some scenarios, the test instrument may be connected to a unit under test through a test fixture that contains probes to make mechanical and electrical connection to test points within the unit under test. In other scenarios, a test instrument may be connected to operational inputs and outputs of the unit under test. For example, an electronic unit designed to be connected to other electronic units over a bus may be tested through a port on the electronic unit designed to connect to a bus. Regardless of the nature of the connection, the test instrument may be configured to generate and measure test signals as may appear on that type of connection.

SUMMARY

The inventors have recognized and appreciated that, in some test systems, a test may be quickly and economically performed by connecting a test instrument to a unit under test through a converter. In embodiments in which a test instrument is available for generating and measuring test signals on a bus that uses a differential signal format, a converter allows functionality of the test instrument to be employed to test a unit under test that interfaces to a bus that does not use differential signals. One or more converters, for example, may be used to convert an optical signal into a differential format.

The inventors have further recognized and appreciated that a converter that accurately converts beginning with the first transition may increase the economics and/or accuracy of the test. Though such a converter may advantageously be used in a test system, the converter may also be used in other systems in which a single-ended to differential conversion is desired.

Accordingly, some aspects of the present disclosure may be embodied as a converter adapted to convert a signal at a single-ended input to a signal at a differential output.

According to one aspect of the invention, a converter adapted to convert a single-ended input signal at a single-ended input to a differential output signal at a differential output is provided. The converter may comprise a first circuit comprising a first input and a first output. The first input may be coupled to the single-ended input to input a single-ended input signal with a first time constant. The first circuit may be configured to capture a midpoint value representative of a midpoint of the single-ended input signal at the first input and to provide at the first output an output signal tracking the first input signal. The output signal may be configured to generate a first differential output signal and a second differential output signal.

In some embodiments, the first circuit may be configured to provide at the first output a voltage based on the captured midpoint value, wherein the voltage decays with a second time constant representative of the first time constant.

According to another aspect of the invention, a method of operation of a converter circuit may be provided. The method comprises generating a filtered signal by coupling an input signal through a high pass filter. The method further comprises generating a signal representative of decay in a midpoint of the filtered signal. The method further comprises generating a first component of a differential signal and a second component of the differential signal based on the filtered signal and an offset based on the signal representative of decay.

According to another aspect of the invention, a system adapted for testing a unit under test having an output may be provided. The system comprises a test instrument having data processing circuitry configured to operate on a differential input. The system further comprises a converter coupled between the unit under test output and the differential input of the data processing circuitry. The converter comprises a high pass filter having an input coupled to the unit under test output, the filter having a filter output. The converter further comprises a first sub-circuit configured to generate a signal representative of decay in a midpoint of a signal at the filter output. The converter further comprises a second sub-circuit configured to generate a first component of a differential signal and a second component of the differential signal based on the signal at the filter output and an offset based on the signal representative of decay.

The foregoing is a non-limiting summary of the invention, which is defined by the attached claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 2A is three superimposed plots showing relative values of a single ended input signal, the single ended input signal after passing through a high pass filter with an RC time constant and a signal representative of decay in the midpoint of the filtered signal;

FIG. 2B is three superimposed plots showing relative values of the signal representative of decay in the midpoint of the filtered signal, a non-inverted component of a differential signal and an inverted component of a differential signal generated from the filtered signal;

DETAILED DESCRIPTION

Figure 1:
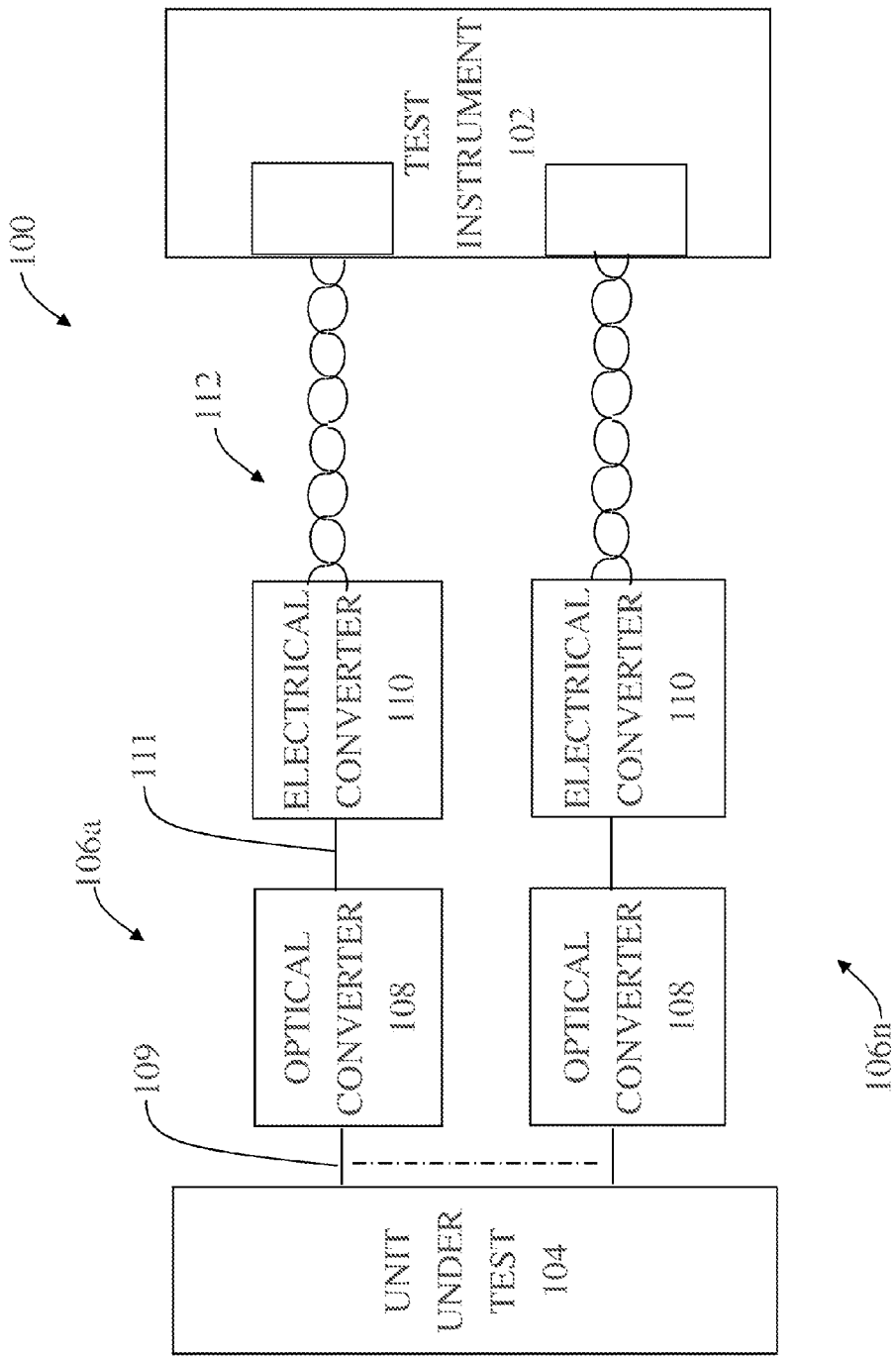
FIG. 1 is a schematic illustration of an exemplary test system using a converter according to some embodiments of the invention.

The inventors have conceived of a single ended to differential signal converter that is well suited for use in a test system. The converter is of simple construction such that it can be made compact enough and with a low enough cost for multiple such converters to be incorporated into a test system that measures many signals in order to fully test a unit under test. Nonetheless, the test system can quickly and accurately make measurements used in testing the unit under test.

The converter may include as an input stage one or more components that act as a high pass filter. The high pass filter may remove any DC component of the input signal such that, in steady state, the filtered signal varies around a midpoint. The midpoint may represent any point within or beyond the two end points established by the low and high voltages of a signal transition. In one instance the point may be the 50% point, but the invention is not limited to any specific definition of a "midpoint". This filtered signal may then be passed to both non-inverting and inverting amplifiers, to generate two output signals that collectively represent the differential output.

Though the high pass filter will eventually output a signal with a constant DC component, the filtered output signal will include a transient component. When an input signal is initially applied to the filter, a signal at the filter output will initially have an AC component that oscillates around a midpoint and the transient component may be reflected as a change in this midpoint over time. As the output of the filter settles, a signal representative of the midpoint will change at a rate that is dependent on the time constant of the filter. However, until this transient component changes to a level that is sufficiently small, the transient component would impact the output of the non-inverting and inverting amplifiers.

To avoid having the transient response impact the signal measured by a test system, a signal representative of the midpoint, including the change of the midpoint associated with the transient component, may be generated. This signal, which is representative of the transient component, may be used as an offset signal to cancel the effect of changes in the midpoint in the signal at the filter output.

Such an offset signal may be generated by capturing a value representing the initial value of the midpoint of the filter output. This value may be captured in a circuit that has a time constant matched to that of the high pass filter. The captured value will change at a rate that approximates the decay of the midpoint of the signal at the filter output. This captured value, as it is allowed to decay, may be used as an offset on the inverted and non-inverted versions of the filter output. The resulting inverted and non-inverted signals provide a differential representation of the single ended input signal.

Such a differential representation is free of errors introduced as the signal at the output of the high pass filter settles. As a result, accurate measurements may be made on that signal without delay associated with waiting for the filter to settle. Avoiding the need to allow the filter to settle allows measurements to be made on a signal quickly, yet accurately.

In a test system, a unit under test may generate numerous outputs that are measured as part of a test. For a unit under test that generates single ended signals that are being measured by a test instrument adapted to measure differential signals, a converter may be used for each of the outputs. In some embodiments, each converter circuit is simply implemented such that the size and cost of each converter allows a converter to be incorporated on each output of the unit under test.

In some embodiments, the converter may include a small number of simple components. The high pass filter, for example, may be a capacitor coupled in series with resistive components. A sub-circuit to capture an initial value of a midpoint may include capacitive components coupled to the filter output through a switching sub-circuit. The switching sub-circuit may be configured with a diode that passes the signal to the capacitive component only when an input signal is initially applied to the converter. In this way, the capacitive component may be charged based on the initial value of the signal at the filter output, including any transient component of that filtered signal.

To ensure that the captured charge represents the midpoint, the sub-circuit to capture an initial value of the midpoint may include a capacitive divider such that the charge that is captures represents the mid-point, rather than the signal peak. Moreover, this sub-circuit may include resistors coupled to the capacitors in that capacitive voltage divider to provide an RC time constant to the sub-circuit to capture an initial value such that the captured value decays at a rate that matches the rate of the change of the midpoint of the filtered signal.

Constructing a converter with resistors, capacitors and diodes provides for simple and low cost construction. For a test instrument that includes multiple inputs, such a circuit may be practically constructed and replicated for each of the multiple inputs. However, it should be appreciated that other implementations are also suitable for generating a signal representative of change in the midpoint of a filtered single ended signal for use as an offset in creating a differential signal.

Moreover, though such a converter is illustrated as used in connection with a test system, it is not a requirement of the invention that the converter be used for that purpose. Such a converter may be used in any scenario in which a single-ended signal is to be converted to a differential signal. Accordingly, FIG. 1, which illustrates an exemplary test system 100, provides just one example of an environment in which a single ended to differential converter may be used.

In the embodiment of FIG. 1, a bus test instrument 102 may be configured to receive differential signals. As one example, bus test instrument 102 may be configured to test a MIL-STD-1553 bus. Here that instrument may be used to test a unit under test that is configured for connection to some other type of bus. As a specific example, unit under test 104 may be configured for connection to a MIL-STD-1773 bus. The MIL-STD-1773 bus uses optical signals, which are not differential. Accordingly, even if the optical signals output by unit under test 104 were converted to electrical form, they would not be differential signals compatible with the inputs to test instrument 102.

The test system 100 includes N channels 106a . . . 106n, each including circuitry suitable for converting a single-ended signal provided by the unit under test 104 into differential form suitable for providing to the test instrument 102. The number N of channels may correspond to the number of outputs provided by the unit under test 104 and therefore may take any suitable value. The test system 100 is not limited to operating with any specific number of channels. Each of the channels illustrated includes an optical converter 108 and an electrical converter 110. In the illustrated example, each of the channels is identical, though the test system 100 is not limited in this respect and the various aspects of the invention are not limited to test systems including identical channels. The optical converter 108 may convert an optical signal 109 output by unit under test 104 into a single-ended electrical signal 111 suitable for processing by the electrical converter 110. The electrical converter 110 may then operate on the single-ended electrical signal 111 received from the optical converter 108 and output a differential electrical signal 112 suitable for receipt by the test instrument 102.

The optical converter 108 may be any suitable optical converter, may take any suitable form, and may operate in any suitable manner for converting the optical signal 109 from the unit under test 104 into the single-ended electrical signal 111 provided to the electrical converter 110. Thus, the test system 100 is not limited with respect to the optical converter, in terms of the configuration or operation of the optical converter.

The electrical converter 110 may be any suitable type of electrical converter for converting a single-ended electrical signal to a differential electrical signal 112 according to the various aspects of the invention described herein. Non-limiting examples of a suitable electrical converter 110 are described in further detail below with respect to FIGS. 3 and 4. Briefly, however, the electrical converter 110 may operate by receiving the single-ended electrical signal 111 from the optical converter 108 and filtering the single-ended electrical signal 111 with a high-pass filter to remove any DC component. The high-pass filter may have an RC time constant associated therewith giving rise to a settling time of the filtered signal. A mid-point voltage of the filtered signal may be determined, and may be set to change with a time constant similar to, or substantially equal to, the RC time constant of the high-pass filter of the electrical converter 110. The changing midpoint value may be used as an offset or reference value for generating both inverted and non-inverted representations of the single-ended electrical signal 111, resulting in the differential signal 112 provided to the test instrument 102.

As mentioned above, and as will be further appreciated from the additional description provided below with respect to FIGS. 3 and 4, the electrical converter 110 may, in at least some embodiments, be formed of simple electrical components, allowing for the electrical converter to be simply manufactured at a relatively low cost. In addition, the electrical converter 110 may operate with a high speed in at least some embodiments, such that the electrical converter 110 may be implemented in a test system, such as test system 100, without degradation in the speed of operation of the test system. The techniques described herein may allow for generation of an accurate differential signal from a single-ended signal prior to settling of a high-pass filter used in generating the differential signal (e.g., the high-pass filter of electrical converter 110), thus avoiding significant time delays in high speed testing environments. The accurate differential signal may include a value representing the energy delivered from the single ended source.

FIG. 2A illustrates three superimposed plots showing relative values of a single-ended input signal, the single-ended input signal after being passed through a high-pass filter (i.e., a filtered signal), and a signal representative of a midpoint of the filtered signal. Signal 202a represents an alternating current (AC) input signal such as that which may be provided to an electrical converter according to one aspect of the present invention, such as electrical converter 110 of FIG. 1. Thus, signal 202a may, for example, correspond to signal 111 in FIG. 1, though not all embodiments are limited in this respect. Signal 202b corresponds to signal 202a after signal 202a has been passed through a high-pass filter (e.g., a high pass filter in electrical converter 110). Filters typically have a settling time associated therewith, which may be characterized by the RC time constant of the filter. Signal 202b shows a constant signal amplitude with a time varying offset or midpoint. Signal 202c represents a midpoint value of signal 202b and, as shown, changes or decays to a steady state value according to the RC time constant of the filter used to generate signal 202b. As can be seen by reference to FIG. 2A, as the value of signal 202c reaches a steady state (which, in this non-limiting embodiment, is equal to about 2.5 Volts), the peak values of signal 202b become substantially equal to the peak values of signal 202a.

FIG. 2B illustrates three superimposed plots showing relative values of a signal representative of the midpoint value of a filtered signal (such as 202c from FIG. 2A), a non-inverted component of a differential signal generated according to various aspects of the invention described herein, and an inverted component of the differential signal. More specifically, signal 202c in FIG. 2B may correspond to FIG. 202c in FIG. 2A. Signal 202d corresponds to a first component of a differential signal generated according to techniques described herein utilizing signal 202c as an offset value. In the non-limiting example of FIG. 2B, signal 202d may correspond to a non-inverted component of the differential signal. Signal 202e may correspond to an inverted component of the differential signal (i.e., having a value substantially equal, but opposite, to that of signal 202d). Because signals 202d and 202e are created from the same input signal and are tracking the same signal, (i.e. the midpoint) the differential voltage amplitude formed by signals 202d and 202e remains substantially the same for every pulse beginning with the first pulse. Maintaining a constant differential voltage amplitude promotes a more predictable transition time. The differential signal amplitude and timing parameters are often important in automatic test equipment for creating a repeatable test results.

As will be described further below, signals 202d and 202e may be generated using signal 202c, for example as an offset value. As a non-limiting example, signal 202d may be generated at least in part by using signal 202c as an offset for signal 202b of FIG. 2A, and optionally applying a gain factor (e.g., via an amplifier or in any other suitable manner). Signal 202e may, for example, be formed in this non-limiting embodiment by using the value of 202c as an offset when generating an inverted version of signal 202b, and then optionally applying a gain factor (e.g., the same gain factor applied in generating signal 202d if one is used in generating signal 202d). Such operation may be further understood by reference to FIG. 3, described below. Also, it should be appreciated that other manners of using signal 202c to generate a differential signal from a single-ended signal are also possible.

Figure 3:
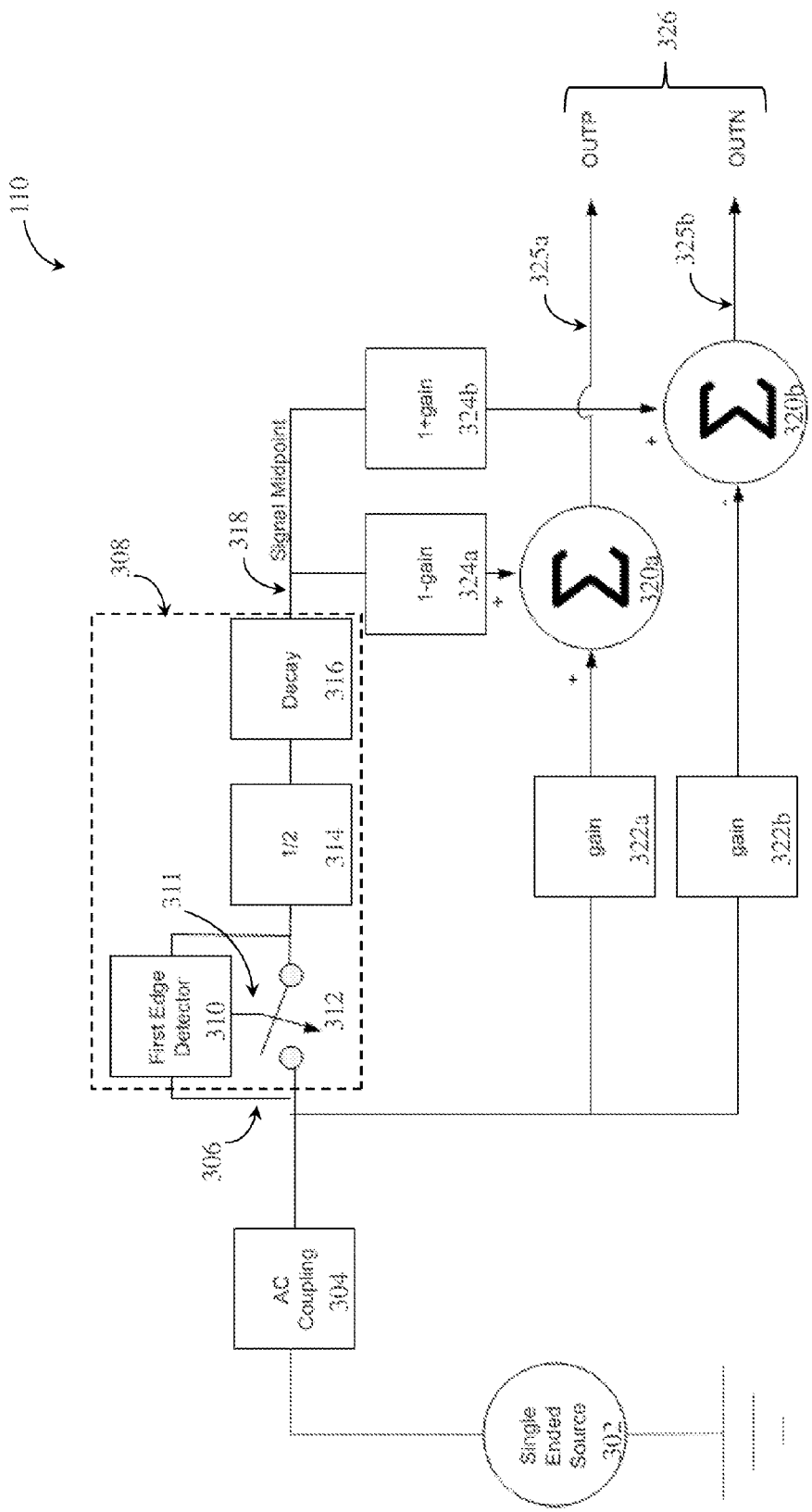
FIG. 3 is a functional block diagram of an exemplary converter configured to generate a differential signal as in FIG. 2B.

FIG. 3 illustrates a non-limiting example of an electrical converter, such as electrical converter 110 in FIG. 1, which may be used to convert a single-ended input signal to a differential signal in the manner described and illustrated with respect to FIGS. 2A and 2B. As shown, the electrical converter 110 in FIG. 3 receives an oscillating single-ended input signal 302, which may be generated in any suitable manner (e.g., signal 302 may represent an output of a unit under test, may represent an electrical version of an optical signal output from a unit under test, or may be produced in any other suitable manner). The oscillating single-ended signal 302 is provided to an AC coupling circuit 304, which provides an AC coupled output signal 306 in single-ended form. The AC coupling circuit 304 may include a high-pass filter, and therefore may operate to remove a DC component from the single-ended signal 302. In this respect, the signal 306 output by AC coupling circuit 304 may represent a filtered version of the signal 302. In those embodiments in which the AC coupling circuit 304 includes a high-pass filter, the filter may be formed in any suitable manner and of any suitable components, and may have an RC time constant associated therewith. The DC bias point on 306 bay be controlled (i.e. by a resistor divider).

A first circuit 308 of the electrical converter 110 may be coupled to the AC coupling circuit 304 to receive output signal 306 of the AC coupling circuit 304. The circuit 308 may generate a signal representative of a midpoint value of the filtered signal output by the AC coupling circuit 304. The midpoint of the filtered signal may change or decay to a steady state value consistent with the time constant of the filter of the AC coupling circuit 304 (i.e., consistent with the settling time of the filter). In the non-limiting embodiment illustrated, the circuit 308 includes a first edge detector 310, a switch 312, a divider 314, and a decay block 316. However, any suitable components and arrangement of components may be used to perform substantially the same function, and it should be appreciated that the illustrated components and arrangement are provided as a non-limiting example.

The first edge detector 310 operates in combination with switch 312 to capture an initial value of the signal 306 output by AC coupling circuit 304. When the first edge detector 310 detects the first edge of signal 306 (e.g., when signal 302 is initially applied to AC coupling circuit 304, or in general when the first transition in the signal 306 is detected), the first edge detector 310 may provide a control signal 311 to a control input of switch 312, thereby causing switch 312 to pass the first edge from a first terminal to a second terminal of the switch such that the first edge reaches block 314. Upon controlling switch 312, the voltage of signal 306 may be divided by divider 314 to produce an edge a fraction of the edge on 306 and applied to decay block 316. The divider 314 may be used to ensure that the initial value captured when switch 312 is closed represents a value related to the midpoint of signal 306. Thus, the divider 314 may divide the voltage of signal 306 by any suitable factor and may take any suitable form. According to one non-limiting embodiment, as illustrated, the divider 314 may divide the voltage of signal 306 by a factor of 2. According to one non-limiting embodiment, the divider may be a capacitive divider, though other types of dividers are also possible. After detecting the first edge, the switch 312 may be opened to prevent subsequent values of signal 306 from being provided to the divider 314.

The decay block 316 may operate to provide an output signal 318 that decays from the initial voltage captured by divider 314 at a rate that, to within a suitable tolerance, matches the rate at which the midpoint value of signal 306 decays. In this way, output signal 318 tracks the midpoint of the input signal. Because the midpoint value of signal 306 may decay at a rate governed by the RC time constant of the filter of AC coupling circuit 304, the decay block 316 may be configured to provide an output signal 318 decaying at a rate governed by the RC time constant of the filter of AC coupling circuit 304. In other words, according to at least one non-limiting embodiment, the decay block 316, and therefore the circuit 308, may be configured to exhibit substantially the same RC time constant as that of the filter of AC coupling circuit 304. The decay block 316 may therefore take any suitable form for performing such functionality, and in some embodiments may be formed of simple, low cost parts.

As shown, the electrical converter 110 further comprises summation circuits 320a and 320b, which may be used to generate the components of a differential signal. In the non-limiting example of FIG. 3, the summation circuit 320a receives a signal resulting from the filtered signal output by AC coupling circuit 304 passing through a gain module 322a, and adds an offset signal resulting from the signal 318 output by the decay block 316 passing through a gain module 324a, which applies one minus the value of the gain applied in gain module 322a. Thus, the signal 318 passing through gain module 324a, which is representative of a midpoint voltage of signal 306, is used as an offset to be added to the signal that results from signal 306 passing through gain module 322a. The output signal 325a from summation circuit 320a may represent a non-inverted component of a differential signal.

The summation circuit 320b receives a signal that is an inverted version of signal 306 from AC coupling circuit 304 passing through gain module 322b, and adds a signal that results from signal 318 passing through gain module 324b, which applies one plus the gain value of gain module 322b. The resulting signal 325b therefore may represent an inverted component of a differential signal, the differential signal including signals 325a and 325b. The inversion of signal 306 to create the input signal supplied to summation circuit 320b may be generated in any suitable manner (e.g., by an inverter between the AC coupling circuit 304 and summation circuit 320b or in any other suitable manner).

The summation circuits 320a and 320b may take any suitable form for performing the described summation. Furthermore, the gain value of gain modules 322a and 322b may be any suitable value, for example, the gain value may be ½ or any other appropriate value. In some embodiments, the absolute value of the gain will be less than 1. Thus, the electrical converter 110, and the various aspects of the invention more generally, are not limited to using any particular types of summation circuits or gain values.

The summation circuits 320a and 320b may be considered second and third circuits of the electrical converter 110. However, such delineation of sub-circuits within the electrical converter 110 is described only for ease of understanding what is shown, and not for purposes of limitation. It should be appreciated that various components of the illustrated converter may be grouped together to form one or more "circuits."

Further, it should be appreciated that FIG. 3 is a simplified representation of a converter. For example, AC coupling 304 may provide an output signal that settles to a non-zero midpoint. As illustrated, for example, in FIG. 2A, the filtered signal out of AC coupling 304 may oscillate around a voltage level of 2.5 V. Regardless of the specific level used, if such a DC bias is present, an adjustment for such a DC bias may be made in any suitable way. That DC bias, for example, may be reflected in signal 318. Alternatively, the DC bias may be compensated for by an amount proportional to the DC bias into summation circuits 320a and 320b in combination with a signal representing the decay generated in decay block 316. Though, in other implementations, the DC bias may be expressed as a common mode component in a differential output.

Figure 4:
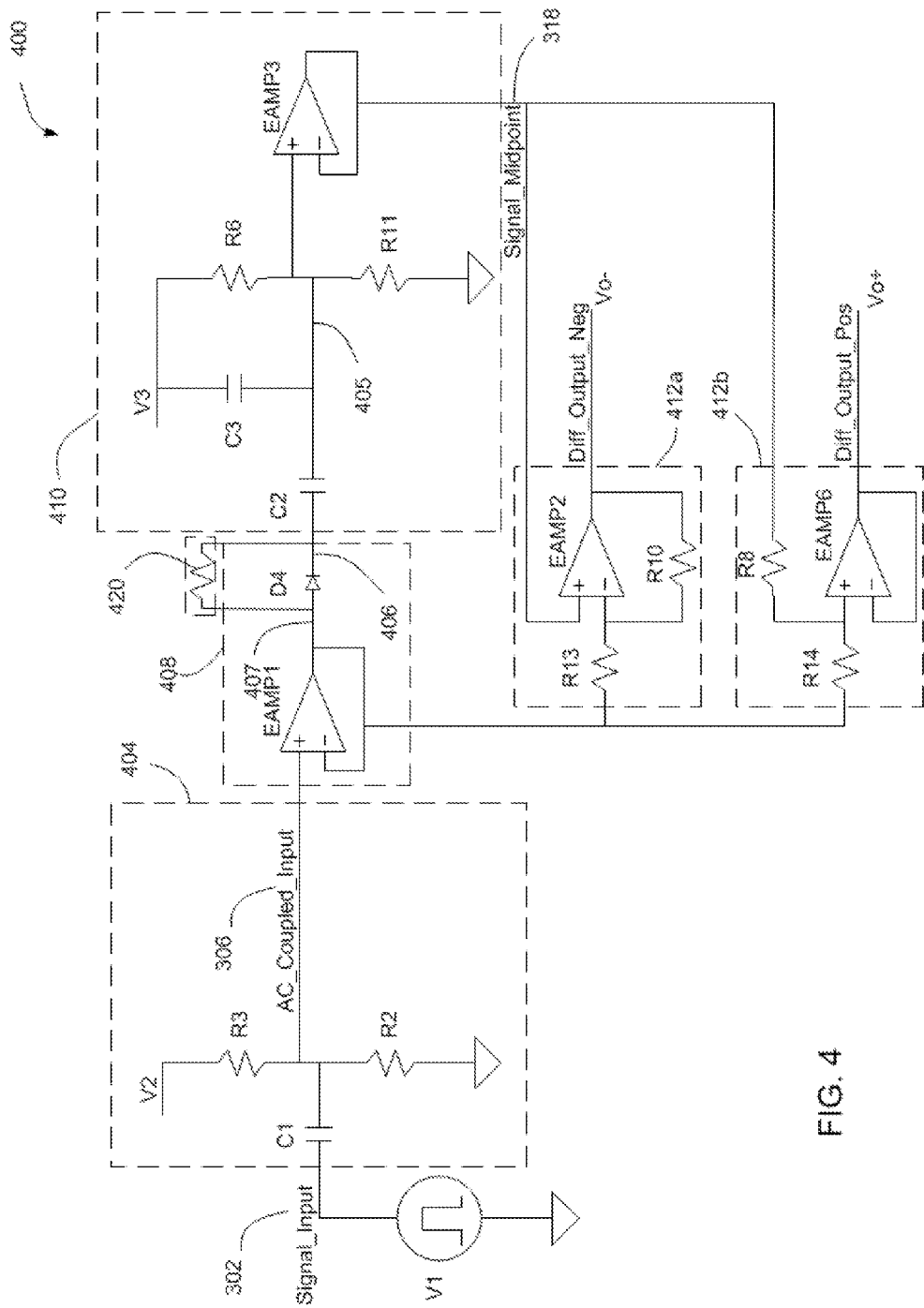
FIG. 4 is an electrical circuit schematic of an exemplary converter configured to generate a differential signal as in FIG. 2B.

FIG. 4 illustrates a non-limiting detailed implementation of circuitry of the type of FIG. 3. As shown, the converter 400 includes an AC coupling circuit 404 configured to produce the signal 306 in response to receiving the signal 302. Switching circuit 408 and decay block 410 function in combination to produce a signal 318 representing a midpoint voltage of the signal 306 produced by the AC coupling circuit 404. Summation and amplification circuits 412a and 412b operate to produce a differential signal having components $V_{O-}$ (the negative differential component) and $V_{O+}$ (the positive differential component). This example shows that 412a and 412b are separate amplifiers, but the circuit may be implemented using a single device with differential outputs. It should be appreciated that other arrangements of circuitry are also possible and that the types of components and configuration of components illustrated in FIG. 4 represent a non-limiting examples.

In this example, AC coupling circuit 404 is constructed of a pair of resistors R2 and R3 and a capacitor C1. C1 is coupled in series with the signal input 302 and acts as a DC blocking capacitor. As illustrated in FIG. 4, C1 is coupled to resistors R2 and R3, which are connected in series to form a voltage divider. In this example, resistors R2 and R3 each have the same value to provide at a node to which capacitor C1 is coupled a constant offset voltage to the output of AC coupling circuit 404 that is equal to one-half of the voltage provided by voltage source V2. In this example, voltage source V2 is a voltage source of five volts, creating a constant offset voltage in AC coupled signal 306 of 2.5 volts as illustrated in FIG. 2A.

One of skill in the art will appreciate the specific values of the components used to form AC coupling circuit 404 are not critical to the invention. However, in this example, resistors R2 and R3 have a value of 500 Ohms. Capacitor C1 has a value of 10 nanoFarads (nF). These values provide a time constant for AC coupling circuit 404 proportional to the value of C1 multiplied by the effective resistance of R2 and R3 in parallel. This RC value will define the time constant of AC coupling circuit 404 and the rate at which a transient component of the signal mid-point will decay.

Decay block 410 will produce an offset signal 318 that includes a component that changes at a rate matching the time constant related to the change of signal 306 output by AC coupling circuit 404. In this embodiment, signal 318 will also include a DC component that matches the fixed offset output by AC coupling circuit 404. Accordingly, FIG. 4 shows that decay block 410 also includes a voltage source V3 and a voltage divider. In this example, voltage source V3 here has a voltage of 5 volts which is the same as V2. The fixed offset voltage is provided at the node between resistors R6 and R11, which are connected to form a voltage divider. In this example, resistors R6 and R11 are of equal resistance such that the voltage at the node between resistors R6 and R11 equals one-half of the voltage of voltage source V3. This fixed DC offset forms a component of the signal at the non-inverting input of amplifier EAMP3, which in this non-limiting example is connected as a non-inverting buffer amplifier.

On the first rising edge of the input signal, a second component of a signal input to the non-inverting terminal 405 of amplifier EAMP3 is derived from a voltage divider formed by capacitors C2 and C3. As can be seen in FIG. 4, capacitor C2 is coupled to the output of switching circuit 408 to the non-inverting input node 405 of EAMP3. Accordingly, when switching circuit 408 outputs a signal representative of the first edge of an input signal 302, capacitors C2 and C3 will charge to a level proportional to the amount that edge exceeds the fixed mid-point of the output of AC coupling circuit 404. Once that edge is removed and switching circuit 408 returns to an OFF state, the voltage at a node between capacitor C2 and C3 will equal approximately one-half of the transient component of the mid-point of signal 306. Once switching circuit 408 is disconnected from capacitor C2, capacitor C2 will have minimal impact on node 405 because the diode D4 is reverse biased, and C3 will discharge at a rate determined by the RC time constant of decay block 410. In this example, the RC time constant may be computed based on the configuration of capacitors C2 and C3 and resistors R6 and R11. The values of capacitors C2 and C3 and resistors R6 and R11 may be selected such that the RC time constant of those components matches the RC time constant of the components of AC coupling circuit 404. In this way, the voltage on node 405 may decay at the same rate as voltage on node 306.

Resistor 420 is optional. Though, in the embodiment illustrated, resistor 420 is connected in parallel with diode D4. In this example resistor 420 across D1 is one option of how to reset and provide initial conditions to the capacitor C2. If the resistor is not used, leakage current across diode D4 may reset capacitor C2. Other implementations are also possible. For example, resistor 420 may be connected from node 406 to a ground or another reference as an alternate method to provide the reset function. Its impact must be considered on the time constant of the midpoint signal. In embodiments in which resistor 420 is present, its impact on the signal 405 must be considered. A large value of resistor 420 compared to R6 and R11 may be chosen to have minimal impact on signal 405.

Switching circuit 408 may be implemented in any suitable way. In this example, switching circuit 408 is implemented with a diode D4. D4 preferably is a schottky diode to minimize the voltage drop across it. The forward drop across diode D4 should be accounted for when choosing the R6 and R11. In this example, the voltage error caused by the drop of D4 is not considered. The diode is connected such that, when capacitor C2 is discharged and a positive going signal is applied to the non-inverting input of amplifier EAMP1, the output of EAMP1 will forward bias diode D4, coupling a voltage proportional to that rising edge signal applied to the input of EAMP1 to capacitor C2. In this way, when a rising edge signal is applied at the input of switching circuit 408, the output of switching circuit 408 will charge capacitor C2 and capacitor C3 which is coupled to it, in proportion to the value of that rising edge signal. Conversely, when capacitor C2 is already charged and a signal which is the same or less than the voltage across C2 is applied as the input to switching circuit 408, the output of EAMP1 will not be sufficient to forward bias diode D4. As can be seen in FIG. 2A, the first edge of the AC coupled signal (e.g., signal 202b in FIG. 2A) has the largest value. Accordingly, capacitors C2 and C3 will be charged based on that largest value. As the value of the subsequent peaks of the AC coupled signal decays, the output of EAMP1 will not be larger than the voltage captured at C2 to again forward bias diode D4. In this way, once capacitor C2 is charged based on the first edge of the output of AC coupling circuit 404, it is effectively disconnected by reverse biased diode D4.

A large-valued resistor across D4 may be used to provide a reset. The voltage across C2 may be reset to a constant value before the data begins to transmit. If the resistance of the large-valued resistor is sufficiently large, then it may have limited impact on affecting the midpoint and time constant. Alternatively, the reset may be provided by any other appropriate circuit configurations. For example a switch across C2 can be a means to reset the capacitor before transmission of data.

It will be appreciated that any suitable component values may be selected. As an example, C2 and C3 each may have a value of 100 pF. Resistors R6 and R11 may have a value of 50 KiloOhms. In this example C2 and C3 contribute to the initial transient voltage divide to create the midpoint signal. The value of C3 and the parallel combination of R6 and R11 form a time constant that substantially matches the time constant of node 306 formed by C1 and the parallel combination of R2 and R3.

FIG. 4 also provides an illustrative configuration for summation and amplification circuits 412A and 412B. In this case, summation and amplification circuit 412B is configured as a non-inverting summing amplifier. One input to the summation and amplification circuit 412B is a buffered version of the output of AC coupling circuit 404. The second input to the summation and amplification circuit 412B is derived from the output of decay block 410, representing the mid-point of the input signal 302, including a component representing the change of the mid-point.

Summation and amplification circuit 412A, in this example, is configured as an inverting summing amplifier. The inputs to summation and amplification circuit 412A are the same as those provided to summation and amplification circuit 412B. However, because of the inverting configuration of summation and amplification circuit 412A, the output of that circuit provides a signal that has an inverse polarity to the output of amplification and summation circuit 412B. Resistors R13 and R10 set the gain of EAMP2, while resistors R8 and R14 set the gain of EAMP6. In this specific example, resistor R13 may have a value of 1 KiloOhm. Resistors R8, R10 and R14 may each have a value of 500 Ohms. Resistor 420 may have a value on the order of 1 MegaOhm.

Although the example in FIG. 4 identifies outputs 412a and 412b that are proportional to the AC Coupled Input 308 and have an offset proportional to the midpoint 318, other signals, such as digital logic signals, created from inputs coupled to the AC Coupled Input 306 and signal midpoint 318 are also in the spirit of this invention. In one example, if the AC coupled input is greater than the midpoint, a digital output with a logic high can be created, while if the AC coupled input is less than the midpoint, a digital output a logic low can be created.

By referring to FIG. 4, it should be appreciated that electrical converters of the type described herein may be fabricated using simple components, which in at least some embodiments may allow for simple, low-cost construction. For example, the illustrated circuitry includes capacitors, resistors, diodes, and amplifiers. Such circuitry may be low cost and easily configured. Also, the circuit may be compatible with other components of various environments, including test system environments or other environments.

Having described several aspects of at least one embodiment of this invention, it is to be appreciated that various alterations, modifications, and improvements will readily occur to those skilled in the art.

As an example of possible variations, the above described circuit is configured for an input signal that starts with a positive-going edge. One of skill in the art will appreciate that, if the input signal starts with a negative-going edge, adjustments may be made to the switching circuit to pass through the first negative-going edge. Other polarities within the converter may be appropriately adjusted.

Further, it should be appreciated that operation of a converter upon initial application of a signal is described. In some scenarios, an input signal line will become active and then go into an idle state before becoming active again. In such an embodiment, so long as the time between instances in which the input signal line becomes active is sufficiently long, the charge captured to represent the midpoint of the filtered signal will have decayed to nearly zero by the time the signal line becomes active. Furthermore, the voltage across C2 must be reset before the signal line becomes active again. Thus, each time the signal line becomes active, the converter will respond as for the initial application of an input signal. Though, it should be appreciated that other sub-circuits may be included or other circuit configurations may be employed to reset the captured value representing the midpoint, if the input signal changes in operation.

Such alterations, modifications, and improvements are intended to be part of this disclosure, and are intended to be within the spirit and scope of the invention. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A converter adapted to convert a single-ended input signal at a single-ended input to an output signal at an output, the converter comprising:
    a first circuit comprising a first input and a first output, the first input being coupled to the single-ended input to receive the single-ended input signal, the single-ended input signal having a first time constant and a midpoint, wherein the first circuit is configured to:
        capture, from an edge of the single-ended input signal, a value representative of the midpoint of the single-ended input signal at the first input;
        generate, from the value captured from the edge of the single-ended input signal, a decaying signal having a second time constant representative of the first time constant of the single-ended input signal; and
        provide the decaying signal at the first output.

2. The converter of claim 1, wherein the first circuit further comprises:
    a circuit configured to receive the edge of the single-ended input signal and reject remaining edges of the single-ended input signal.

3. The converter of claim 1, wherein the output signal at the output of the converter is a differential signal, and wherein the converter further comprises circuitry configured to receive the decaying signal, a non-inverted differential signal component derived from the single-ended input signal, and an inverted differential signal component derived from the single-ended input signal, and to modify both the non-inverted differential signal component and the inverted differential signal component based on the decaying signal to produce the output signal.

4. The converter of claim 1, wherein the first circuit further comprises:
a second circuit comprising a second input, a first offset input, and a second output, the second input being coupled to the single-ended input, the first offset input being coupled to the first output, and the second circuit being configured to provide at the second output a second output signal proportional to a second input signal at the second input offset by an amount proportional to a first offset signal at the first offset input.

5. The converter of claim 4, wherein the first circuit further comprises:
a third circuit comprising a third input, a second offset input, and a third output, the third input being coupled to the single-ended input, the second offset input being coupled to the first output, and the third circuit being configured to provide at the third output a third output signal proportional to, and inverted relative to, a third input signal at the third input offset by an amount proportional to a second offset signal at the second offset input.

6. The converter of claim 1, wherein the first circuit further comprises:
a second circuit comprising a second input, a first offset input, and a second output, the second input being coupled to the single-ended input, the first offset input being coupled to the first output, and the second circuit being configured to provide at the second output a second digital output signal wherein a logic state of the second digital output signal is determined by a comparison between the second input and the first offset input.

7. The converter of claim 2, wherein:
the circuit comprises a switching circuit and an energy storage device, the switching circuit being configured to, upon detection of the single-ended input signal at the single-ended input, selectively couple a first voltage to the energy storage device, wherein the first voltage is representative of a first input voltage at the first input.

8. The converter of claim 7, wherein:
the switching circuit is further configured to selectively block the first voltage representative of the first input voltage at the first input from reaching the energy storage device subsequent to detection of the single-ended input signal at the single-ended input.

9. The converter of claim 7, wherein:
the energy storage device comprises at least one capacitor; and
the switching circuit comprises a diode, the diode and the at least one capacitor being connected such that:
the diode is forward biased to charge the capacitor on the edge and is reverse biased on subsequent edges of the single-ended input signal.

10. The converter of claim 1, wherein the first circuit further comprises:
a switch having a first terminal, a second terminal and a control input; and
an edge detector, having an input coupled to the first input, and an output coupled to the control input of the switch, the edge detector being configured to change the control input, thereby closing the switch, upon detection of the edge of the single-ended input signal and to change the control input, thereby opening the switch, after the edge.

11. The converter of claim 1, wherein the edge of the single-ended input signal is a first rising edge of the single-ended input signal.

12. A method of operation of a converter circuit, the method comprising:
generating a filtered signal by coupling a single-ended input signal through a high pass filter;
detecting a transition in the filtered signal;
establishing an initial value representative of a midpoint of the filtered signal in response to detecting the transition in the filtered signal,
generating, from the initial value, a decaying signal representative of a midpoint of the filtered signal; and
generating a first component of a differential signal and a second component of the differential signal based on the decaying signal.

13. The method of claim 12, wherein detecting the transition in the filtered signal comprises detecting a first rising edge of the filtered signal, and wherein establishing the initial value representative of a midpoint of the filtered signal in response to detecting the transition in the filtered signal comprises establishing the initial value representative of the midpoint in response to detecting the first rising edge of the filtered signal.

14. The method of claim 12, wherein:
establishing the initial value representative of the midpoint comprises capturing a charge having a magnitude proportional to a value of the filtered signal in response to detecting the transition in the filtered signal.

15. The method of claim 12, wherein:
generating the decaying signal comprises generating a signal having a value representative of a level that is one half of the filtered signal.

16. The method of claim 15, wherein:
generating a first component of a differential signal and a second component of the differential signal comprises:
generating the first component by providing a positive amplification to the filtered signal offset by the decaying signal; and
generating the second component by providing a negative amplification to the filtered signal offset by the decaying signal.

17. A converter circuit comprising:
an edge detector coupled to a single-ended input to receive a single-ended input signal;
an edge capture component coupled to the edge detector and controllable by the edge detector to capture an edge of the single-ended input signal;
a divider circuit coupled to the edge capture component and configured to receive the edge of the single-ended input signal captured by the edge capture component; and
a decay circuit having an input coupled to an output of the divider circuit.

18. The converter circuit of claim 17, wherein the edge capture component comprises a switch.

19. The converter circuit of claim 17, further comprising first and second gain stages coupled to an output of the decay circuit and configured to produce respective output signals.

20. The converter circuit of claim 17, wherein the respective output signals of the first and second gain stages together represent a differential signal.

21. The converter circuit of claim 17, wherein the single-ended input signal has a first time constant, and wherein the decay circuit is configured to generate a decaying signal having a second time constant representative of the first time constant.

22. The converter circuit of claim 21, wherein the divider circuit is configured to produce a signal representing a midpoint of the edge of the single-ended input signal captured by the edge capture component.

* * * * *